United States Patent [19]

Maston

[11] Patent Number: 5,323,401
[45] Date of Patent: Jun. 21, 1994

[54] OPTIMIZATION OF TEST STIMULUS VERIFICATION

[75] Inventor: Gregory A. Maston, Tempe, Ariz.

[73] Assignee: Motorola, Inc., Schaumburg, Ill.

[21] Appl. No.: 649,630

[22] Filed: Feb. 1, 1991

[51] Int. Cl.[5] .................................. G01R 31/28
[52] U.S. Cl. ................................. 371/27; 364/580
[58] Field of Search ................ 371/27, 28; 364/580

[56] References Cited

U.S. PATENT DOCUMENTS

| | | | |
|---|---|---|---|
| 4,894,829 | 1/1990 | Monie et al. | 371/20.1 |
| 4,924,430 | 5/1990 | Zasio et al. | 364/578 |
| 5,046,033 | 9/1991 | Andreason et al. | 364/580 |
| 5,095,454 | 3/1992 | Huang | 364/578 |

OTHER PUBLICATIONS

Milne, B., "Timing, Not Speed, Counts the Most When Testing Fast VLSI ICs", *Electronic Design*, May 29, 1986, pp. 132-142.

Kawabata, Y. et al., "PGTOOL: An Automatic Interactive Program Generation Tool for Testing New-Generation Memory Devices", *1988 International Test Conf.*, pp. 559-568.

Novellino, J., "Software Generates ASIC Test Programs", *Electronic Design*, Apr. 27, 1989, pp. 59-62.

Verhelst, B., "Using a Test-Specification Format in Automatic Test-Program Generation", *IEEE Design & Test of Computers*, Feb. 1990, pp. 39-45.

*Primary Examiner*—Stephen M. Baker
*Attorney, Agent, or Firm*—Harry A. Wolin; Michael Waters

[57] ABSTRACT

Optimization of test stimulus verification by analyzing test stimulus timing information against restriction rules derived from a static analysis of a digital system. The result of this analysis is used to determine test stimulus timing which cannot cause a timing violation and to remove the associated vectors from further checking. Only those vectors which can violate timing constraint rules are checked individually to find states which violate the timing rules.

5 Claims, 3 Drawing Sheets

—PRIOR ART—

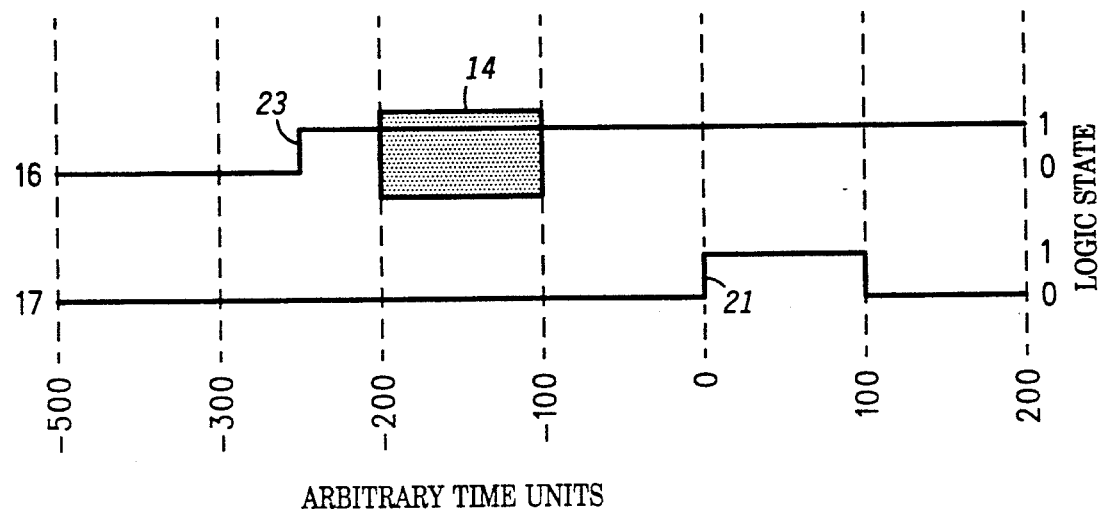
FIG. 4
FIG. 5
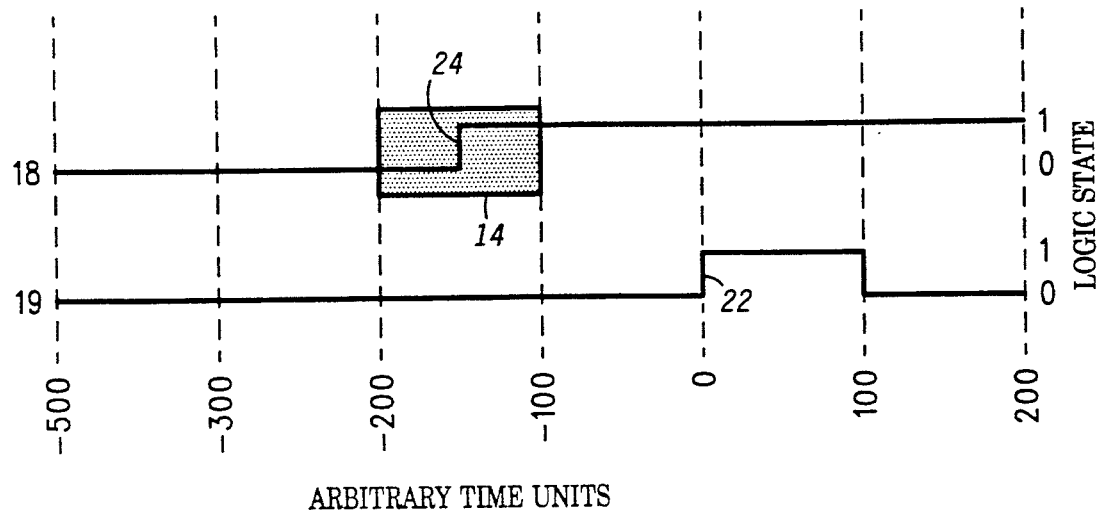

OPTIMIZATION OF TEST STIMULUS VERIFICATION

BACKGROUND OF THE INVENTION

The present invention relates, in general, to optimization of the verification of the validity of automated test procedures, and more particularly to electrical function and timing tests of application specific integrated circuit parts (ASIC parts).

Electrical testing of ASIC parts utilizes complex and expensive automated test equipment, special purpose machines designed to apply a set of input stimuli to an ASIC part and to compare the resultant set of output states with a set of expected output states. The set of stimuli and expected output state for each time step is unique to each design of an ASIC part. The set of stimuli and expected output states to be used for a given design is typically generated by use of event based digital simulation software such as LASAR (trademark of Teradyne, Inc.), Verilog (trademark of Cadence, Inc.), or Quicksim (trademark of Mentor Graphics, Inc.). This software accurately simulates the internal functioning and timing of the ASIC part, creating time-based stimulus and expected response information as a combination of timing information and state information.

The timing information can specify a unique timing for each potential state change of each signal within the state based vector if required, but typically only a relatively small amount of timing information is needed. Due to the design of automated test equipment, a single set of timing information is typically applied to a large number of state based vectors at one time and is encoded separately as a uniquely identified timing statement. Timing information is typically defined as being relative to a master clock signal, the leading edge of the clock pulse is typically used for a timing reference. This reference is used internally by the test equipment to accurately trigger the application of signals to the pins of the ASIC device or to enable sensors for output signals.

Timing constraints are placed on the state based vector information and timing information due to the internal design of the ASIC part as well as limitations of the test equipment. Timing constraint information typically consists of a Set of times when a given signal must remain in a stable state relative to another signal and is derived by a static timing analysis of each ASIC part. Static timing analysis is a procedure whereby the internal logic paths of an ASIC part are traced to determine the internal logic path delays from each input to each time critical functional block such as a flip-flop. This internal logic path delay information is used to derive a set of timing restriction rules for each input of the ASIC part. The set of timing restriction rules specify the times at which a signal applied to each input must remain stable relative to another signal for the ASIC part to operate correctly. In order to assure that the part is being tested with a valid stimulus set, both the state information must be verified and the timing restriction rules must be compared with the time-based stimulus information to ensure that no constraints are violated during the testing procedure.

The prior art method is to process the mixed stimulus information for each vector of the mixed time and state based vector information; identify the times when a state transition is not allowed from the timing constraint information; then check for state changes in the state-based stimulus information during those times. This method is straightforward and thorough, but performs a great many unnecessary checks. A typical ASIC part will have more than 10,000 vectors and some ASIC parts have 500,000 or more. So any reduction in the number of verification steps required is highly desirable. In addition, it is highly desirable to allow different automated test equipment to be selected immediately before the tests are performed rather than some weeks earlier during the design activity.

SUMMARY OF THE INVENTION

Briefly stated, the present invention provides a method for optimization of test stimulus verification by filtering out verification checks that can be proven to be unneeded based on an analysis of timing information alone. Due to inherent test equipment limitations the number of timing changes in the test stimulus information is always much less than the number of state changes. As a result, speed and efficiency of the test generation process is greatly enhanced by eliminating unneeded checking based on this analysis. The form of the timing constraint information is designed to facilitate the addition of automated tester constraints from a library of constraints created for each model of automated tester of interest. In addition, the organization of the information provided by the present invention greatly simplifies the checking procedure.

BRIEF DESCRIPTION OF THE DRAWINGS

FIG. 4 is a logic timing diagram illustrating the timing restriction rule of FIG. 3 as applied to a first set of test timing information; and FIG. 5 is a logic timing diagram similar to FIG. 4, but illustrating a second set of test timing information.

DETAILED DESCRIPTION OF THE DRAWINGS

Figure 1:
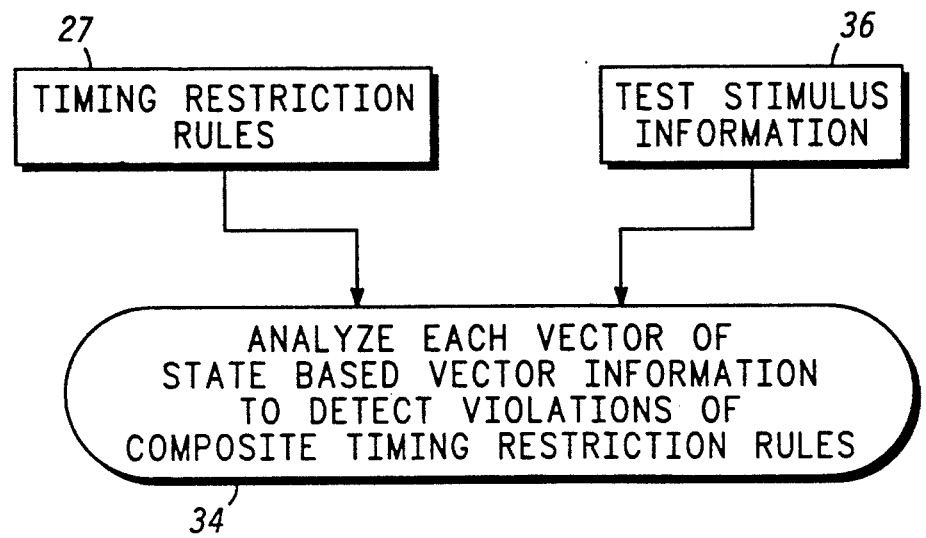
FIG. 1 shows an architectural model of a method of verification according to the prior art.

FIG. 1 shows an architectural model of a method of verification typical of the prior art. A set of timing restriction rules 27 is derived from static timing analysis of the ASIC part. A set of test stimulus information 36 is generated by use of digital simulation software such as LASAR (trademark of Teradyne Inc.), Verilog (trademark of Cadence, Inc.), or Quicksim (trademark of Mentor Graphics, Inc.) which accurately simulates the internal functioning and timing of the ASIC part. Test stimulus information 36 consists of a combination of timing information and state information and is typically coded as a set of timed vectors which specify a time together with the state of each signal. An analysis step 34 is performed in which the time for each state change is compared with the set of timing restriction rules 27 and any violations are noted for later correction. This verification is required for every vector regardless of timing.

Figure 2:
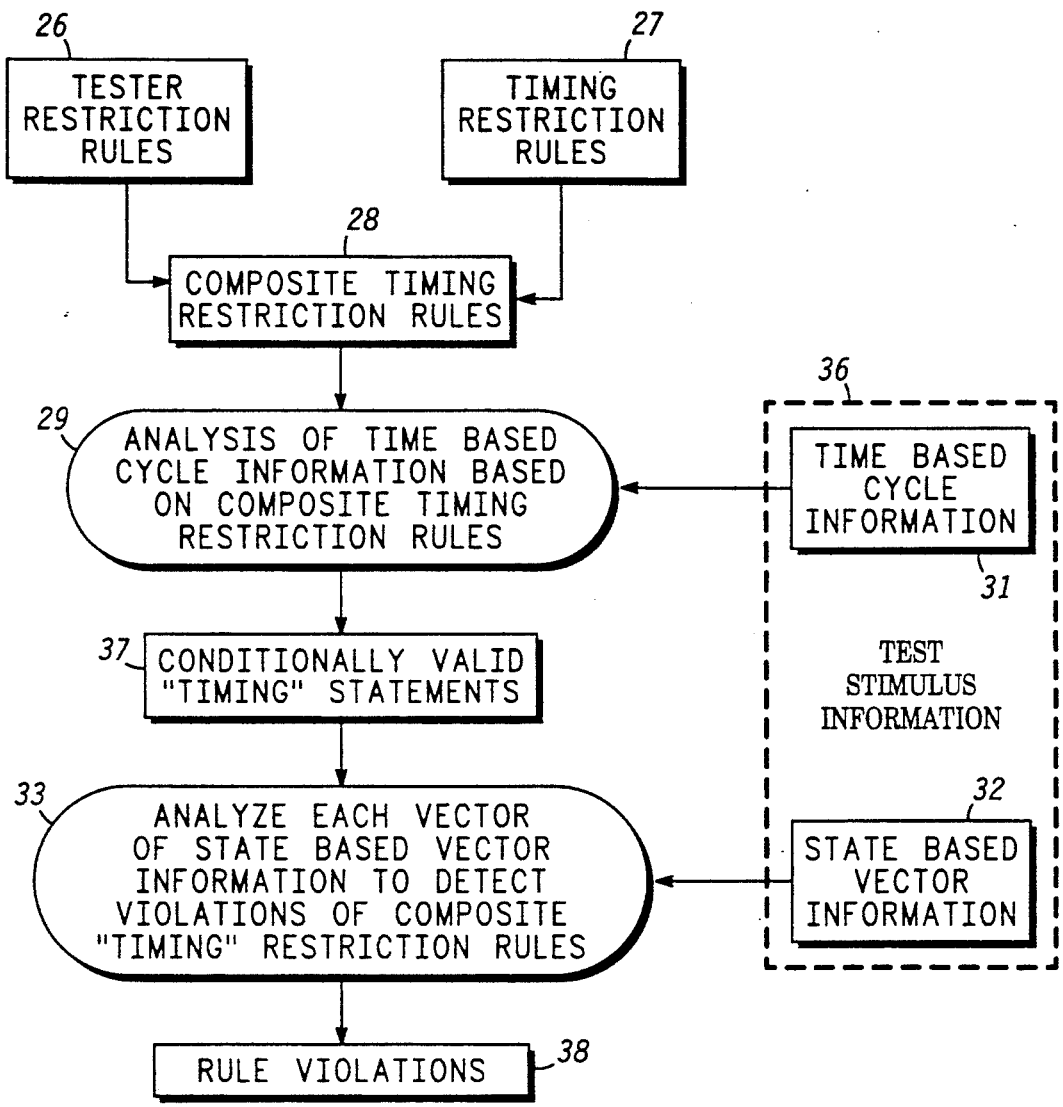
FIG. 2 shows an architectural model of a method of verification in accordance with the present invention.

FIG. 2 shows an architectural model of a method of verification incorporating this invention. Timing restriction rules 27 derived from static timing analysis of the ASIC part are typically modified by a set of tester restriction rules 26 to form a set of composite timing restriction rules 28. Test stimulus information 36 is split into two sub-sets: a set of time based cycle information 31 and a set of state based vector information 32. Time based cycle information 31 consists of a series of statements which define the relative timing to be used for some portion of the test sequence. State based vector information 32 consists of a series of statements which define the logical state of each signal required for the tests to be performed. Typically a single statement from time based cycle information 31 will apply to a large number of vectors from state based vector information 32. That is to say, the typical number of statements in the set of time based cycle information 31 is much less than the number of vectors in the set of state based vector information 32. The present invention makes use of this relationship to increase the efficiency of the verification process.

A first analysis step 29 compares statements from time based cycle information 31 with rules from set of composite timing restriction rules 28 to produce a set of conditionally valid rules 37. Conditionally valid rules 37 consist of a list of state transitions which would produce a violation of timing constraints if found while the related timing statement is in use. This is explained in more detail as part of the timing statement description below. A second analysis step 33 checks each of the vectors to which conditionally valid rules 37 apply from the set of state based vector information 32. This produces a set of rule violations 38 which require corrective action to produce a valid test.

Figure 3:
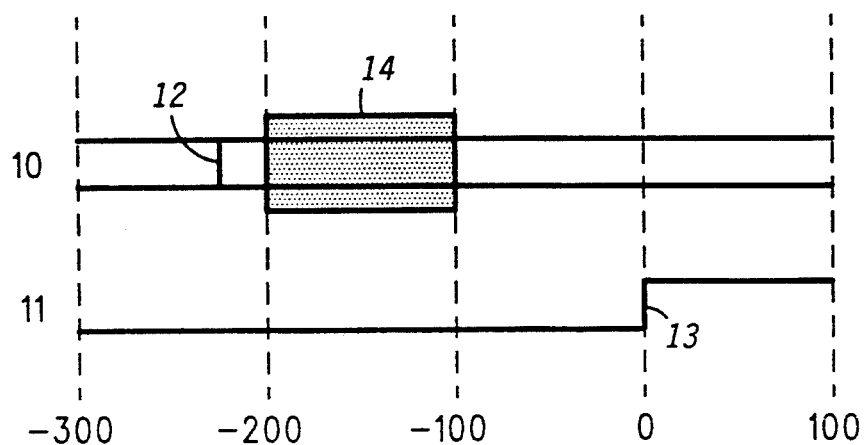
FIG. 3 is a logic timing diagram illustrating a timing restriction rule.

FIG. 3 is a logic timing diagram illustrating a simple example of a typical timing restriction rule according to this invention. FIG. 3 depicts a data signal 10 and a clock signal 11. Data signal 10 exhibits a state change 12 when data signal 10 changes either from a logical zero state to a logical one state or from a logical one state to a logical zero state at the time shown. Clock signal 11 has a rising edge 13 and is used as the zero reference time for this timing diagram.

The timing relationship depicted is typically expressed as formal rules having a carefully defined structure. One typical format of these rules utilizes a modified English sentence structure as a template to form a statement used to define a rule Each statement begins with a keyword such as "data" identifying the type of signal being specified by the rule, followed by a keyword "in" indicating the specification of a logical state, and a logical state value ("1" or "0"). Keywords and associated values are separated by any combination of blanks, tabs, or new lines, with statements and substatements being separated by semicolons ( ";") . Multiple values related to a keyword are grouped by means of parentheses ( "(", ")") . Typical composite timing restriction rules 28 (FIG. 2 and FIG. 3) are as follows:

data in 1 for (−200,−100) when clock rises;

data in 0 for (−200,−100) when clock rises;

In this example, satisfying either of these rules is sufficient to satisfy the timing restriction requirement. Both rules specify a time window 14 which starts at 200 time units and ends at 100 time units before clock signal 11 changes to a logical one state. The first rule requires data signal 10 to have a stable logical one state as input during time window 14. Likewise the second rule requires data signal 10 to have a stable logical zero state as input during time window 14. In this example, any change of logical state of data signal 10 which occurs during the time starting at 200 time units and ending at 100 time units before the zero reference time is an error.

FIG. 4 and FIG. 5 illustrate the relationship between an example of composite timing restriction rules 28 (FIG. 2) as illustrated by time window 14 (FIG. 3) and an example of time based cycle information 31 (FIG. 2). The timing relationships depicted in FIG. 4 and FIG. 5 are typically expressed as formal statements having a carefully defined structure in a similar fashion to the statements related to FIG. 3. In this example the information is extracted from the test stimulus information by extracting timing related information from state related information by methods well known in the art. Two typical specification statements for time based cycle information 31 (FIG. 2) using this structure are as follows:

ts 1 period 1000; clock (0,100); data (−250);;

ts 2 period 1000; clock (0,100); data (−150);;

In this example the first two letters designate that this statement is a timing statement. The letters are followed by a sequence number which uniquely identifies the statement for reference purposes. Statement "ts 1" specifies: a repetition with a time period of 1000 time units, a clock signal 17 with a rising edge 21 at 0 time units and a falling edge at 100 time units, and a data signal 16 with a state change 23 at −250 time units. Likewise statement "ts 2" specifies: a repetition with a time period of 1000 time units, a clock signal 19 with a rising edge 22 at 0 time units and a falling edge at 100 time units, and a data signal 18 with a state change 24 at −150 time units.

FIG. 4 is a logic timing diagram illustrating the timing restriction rule of FIG. 3 applied to the timing statement "ts 1". Rising edge 21 is used as the zero reference time for this timing diagram. Only part of a clock repetition period is shown for simplicity. Time window 14 illustrates the effect of the timing restriction rules illustrated in FIG. 3 as applied to clock signal 17. Inspecting data signal 16, it is clear that state change 23 cannot occur within the forbidden time window 14. In accordance with the present invention, no checking is performed for state based vector information which is applied while the statement labeled "ts 1" is in effect.

By contrast, FIG. 5 is a logic timing diagram illustrating the timing restriction rule of FIG. 3 applied to the timing statement "ts 2". Inspection of data signal 18 in this simple case shows that if state change 24 occurs at all then it will occur within forbidden time window 14. Thus any occurrence of state change 24 while the statement labeled "rs 2" is in effect is considered to be an error condition. Further checking is performed to determine if errors actually occur in these vectors.

A typical form for state based vector information 32 (FIG. 2) is as follows:
  use ts ;
  c 1 {clock=0; data=0; };
  c 2 {clock=1; data=0; };
  c 3 {clock=0; data=0; };
  c 4 {clock=1; data=1; };
  use ts 2;
  c 11 {clock=0; data=0; };
  c 12 {clock=1; data=0; };
  c 13 {clock=0; data=0; };
  c 14 {clock=1; data=1; };

In the small example above, the keyword "use" designates a timing statement that is to be used for state changes until changed by a following "use". The keyword "c" designates a vector and is identified by a sequence number following the "c". The various states to be applied are enclosed in braces ( "{" and "}") and consist of a signal name, an equal sign ( "=") and a logical state ( "0" or "1"). Semicolons ( ";")serve to terminate each statement or sub-statement as before.

The first "use" statement designates the timing statement labeled "ts 1" as the one to be used to generate state changes. Analysis step 29 (FIG. 2) has shown that no vectors or combination of vectors which use the timing statement labeled "ts 1" can violate the timing constraint rules. As a result there are no conditionally valid rules 37 (FIG. 2) which apply to this statement and no state checks are performed on the vectors applied with this rule in effect (labeled "c 1", "c 2", "c 3", and "c 4" above). The second "use" statement designates the timing statement labeled "rs 2". Analysis step 29 (FIG. 2) produces a single conditionally valid rule 37 (FIG. 2) which specifies that a transition from a zero state to a one state of both "clock" and "data" in the same time step is a violation. Accordingly each vector using this timing statement is checked individually for violations of this rule; in this example the statements "c 11", "c 12", "c 13", and "c 14" must be checked.

Consider the first of these statements, a vector labeled "c 11". For this statement both "clock" and "data" are zero so there is no rising edge 22 for the signal "clock" hence no rule violation is possible. The next vector, labeled "c 12", shows "clock" transition to a one state and therefore a rising edge 22, but "data" continues in a "zero" state hence no rule violation occurs. The following vector, labeled "c 13", repeats the statement labeled "c 11" and as before no rule violation occurs. The final vector of this example, labeled "c 14", shows both "clock" and "data" changing to a one state from the previous vector. Applying the timing rule "ts 2" to these state changes creates the situation where clock signal 19 (FIG. 5) has rising edge 22, with data signal 18 having state change 24 at a time 150 time units earlier within time window 14. This is a violation of timing restriction rules 28 (FIG. 2) and is an error condition. This and any similar errors must be corrected before testing of the ASIC part can proceed. Thus the present invention avoids wasting time testing vector statements for state changes that can be shown to be valid by a timing analysis, while still performing a complete verification of the test stimulus information. Even when individual vector checks must be performed only state checks are required rather than checking the combination of state and timing, resulting in much faster checking. In this example this represents a saving of over 50% of the time spent in checking compared to the prior art, actual test stimulus information which has been generated for typical devices shows even greater savings.

Test stimulus information 36 (FIG. 2) used as examples in FIG. 4 and FIG. 5 are representative of time based cycle information 31 (FIG. 2) and state based vector information 32 (FIG. 2) used for actual ASIC part tests, but are structured to be as simple and straightforward as possible. Typical time based cycle information 31 (FIG. 2) has a hundred or more relative times specified in each statement and typical state based vector information 32 (FIG. 2) may have as many as 300 signal states specified per vector and as many as 500,000 vectors to test a single ASIC part. Every verification step involves thousands of sub-steps so even with the help of high speed computers, verification of test stimulus information is extremely laborious.

This invention provides a method to reduce unnecessary checking of massive amounts of information by using an analysis of stimulus timing information and timing restriction rules to avoid individual checking of sets of vectors which cannot violate the timing restriction rules. In addition, the organization of information provided by this invention facilitates verification of other useful information such as tester capability limits.

I claim:

1. A method for optimization of test stimulus verification, comprising:

separating test stimulus information into time based cycle information and state based vector information;

deriving a set of timing restriction rules from at least a static timing analysis of the device under test;

comparing the set of timing restriction rules with the time based cycle information;

removing from further analysis time based cycle information which an analysis of timing restriction rules shows cannot produce violations for any state transitions; and comparing the state information associated with the remaining time based cycle information to the timing restriction rules.

2. The method according to claim 1 in which the timing restriction rules are modified timing restriction rules that allow for timing capabilities and limitations of the test equipment.

3. A method for optimization of test stimulus verification, comprising:

separating a complete set of test stimulus information into time based cycle information and state based vector information;

performing an analysis of internal logic paths of the device under test to derive a set of timing restriction rules;

comparing the set of timing restriction rules with the time based cycle information in the complete set of test stimulus information;

removing all unconditionally valid time based cycle information from further analysis; and comparing the state information associated with the remaining time based cycle information to the timing restriction rules.

4. The method according to claim 3 in which the timing restriction rules are modified timing restriction rules that allow for timing capabilities and limitations of the test equipment.

5. A method for optimization of test stimulus verification, comprising:

separating a complete set of test stimulus information into time based cycle information and state based vector information;

performing an analysis of internal logic paths of the device under test to derive a set of timing restriction rules;

modifying the set of timing restriction rules according to a set of tester restriction rules so as to produce a set of composite timing restriction rules which are used for further analysis;

comparing the set of composite timing restriction rules with the time based cycle information in the complete set of test stimulus information;

removing all unconditionally valid time based cycle information from further analysis; and comparing state information associated with the remaining time based cycle information to the timing restriction rules.

* * * * *